(12) United States Patent
Wada

(10) Patent No.: US 7,880,566 B2
(45) Date of Patent: Feb. 1, 2011

(54) BALANCED LATTICE FILTER DEVICE

(75) Inventor: Koichi Wada, Yokohama (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 160 days.

(21) Appl. No.: 11/984,639

(22) Filed: Nov. 20, 2007

(65) Prior Publication Data

US 2008/0117000 A1    May 22, 2008

(30) Foreign Application Priority Data

Nov. 22, 2006    (JP)    ............................. 2006-315490

(51) Int. Cl.
*H03H 9/54* (2006.01)
*H03H 9/64* (2006.01)

(52) U.S. Cl. ...................... 333/190; 333/193

(58) Field of Classification Search .......... 333/189–196
See application file for complete search history.

(56) References Cited

U.S. PATENT DOCUMENTS

| | | | | |
|---|---|---|---|---|
| 1,974,081 | A | * | 9/1934 | Mason ..................... 333/190 |
| 2,173,894 | A | * | 9/1939 | Atwood ..................... 333/190 |
| 2,222,417 | A | * | 11/1940 | Mason ..................... 333/190 |
| 2,619,535 | A | | 11/1952 | Prior et al. |
| 2,929,031 | A | * | 3/1960 | Kosowsky ................ 333/190 |
| 2,980,872 | A | * | 4/1961 | Storch ..................... 333/190 |
| 4,126,837 | A | | 11/1978 | Koyamada et al. |
| 5,847,626 | A | * | 12/1998 | Taguchi et al. ............ 333/193 |
| 6,624,725 | B2 | | 9/2003 | Ueno |
| 7,135,940 | B2 | * | 11/2006 | Kawakubo et al. ......... 333/17.1 |
| 2002/0053957 | A1 | | 5/2002 | Ueno |
| 2006/0055488 | A1 | * | 3/2006 | Ten Dolle et al. ........... 333/190 |
| 2006/0164183 | A1 | | 7/2006 | Tikka et al. |

FOREIGN PATENT DOCUMENTS

| | | |
|---|---|---|
| JP | 51-003834 | 1/1976 |
| JP | 04-087411 A | 3/1992 |
| JP | 05-007125 A | 1/1993 |
| JP | 2000-261269 A | 9/2000 |
| JP | 2001-223559 A | 8/2001 |
| JP | 2002-152008 A | 5/2002 |
| JP | 2002-223147 | 8/2002 |
| JP | 2005-073298 A | 3/2005 |
| JP | 2006-502634 | 1/2006 |

* cited by examiner

*Primary Examiner*—Barbara Summons
(74) *Attorney, Agent, or Firm*—Arent Fox LLP

(57) ABSTRACT

A lattice-type filter circuit includes first and second balanced signal terminals; first and second balanced signal terminals; a first resonator connected to a series arm between the first balanced signal terminal on the input side and the first balanced signal terminal on the output side; a second resonator connected to a series arm between the second balanced signal terminal on the input side and the second balanced signal terminal on the output side; a first resonant circuit including impedance elements, being connected to a lattice arm between the first balanced signal terminal on the output side and the second balanced signal terminal on the input side; and a second resonant circuit including impedance elements, being connected to a lattice arm between the second balanced signal terminal on the output side and the first balanced signal terminal on the input side.

18 Claims, 14 Drawing Sheets

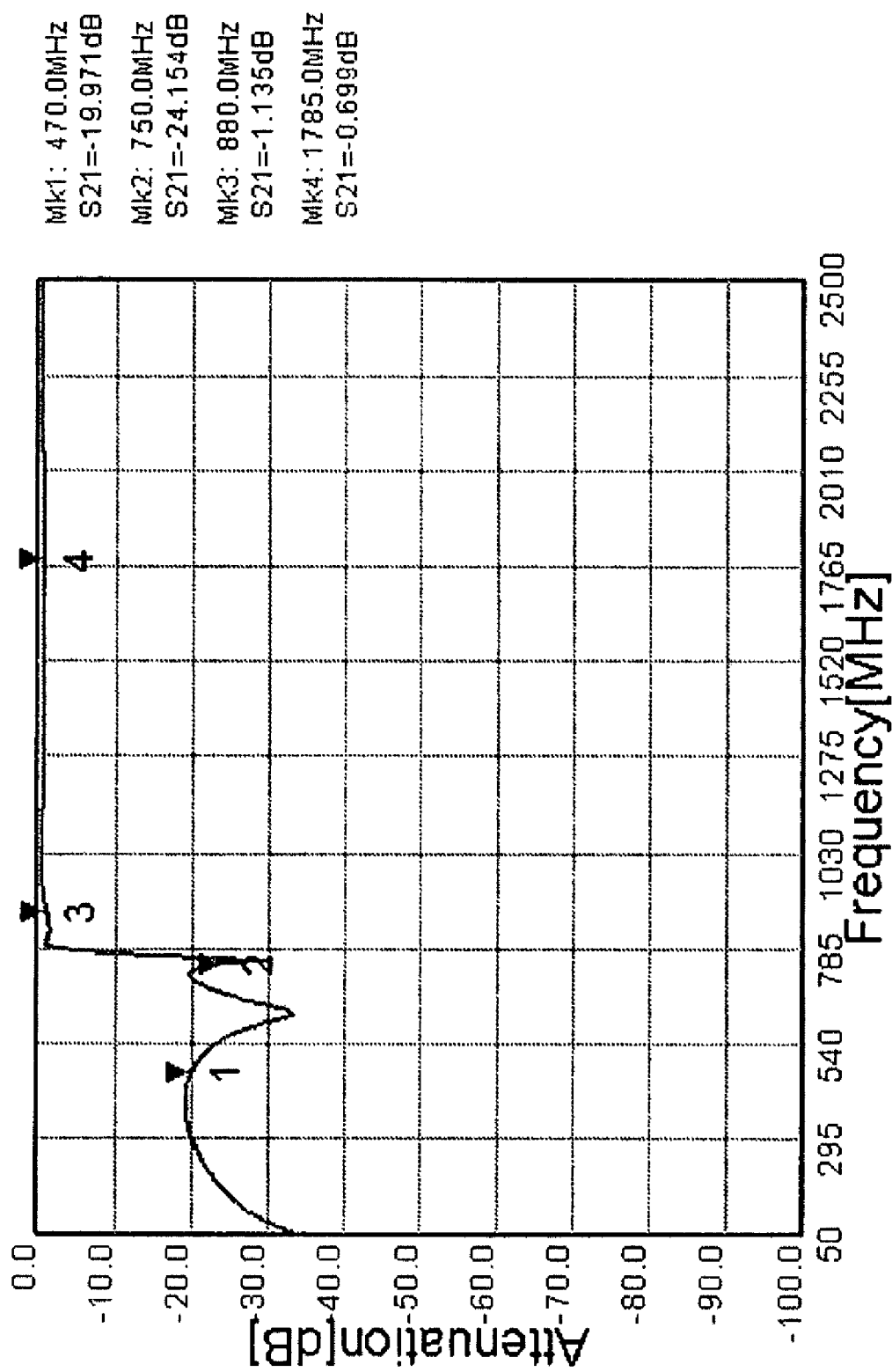

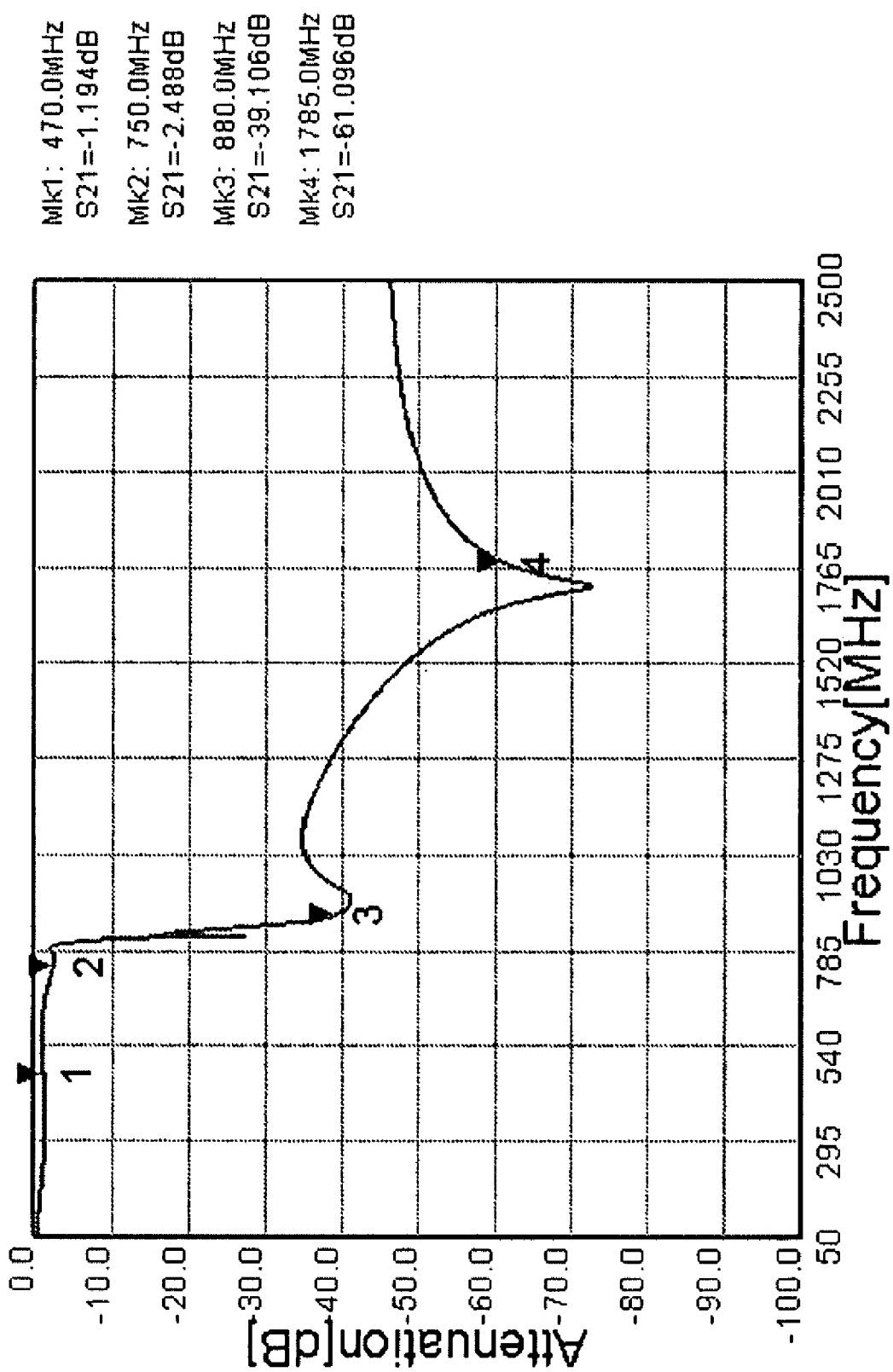

BALANCED LATTICE FILTER DEVICE

CROSS-REFERENCE TO RELATED APPLICATIONS

This application is based upon and claims the benefit of priority from the prior Japanese Patent Application No. 2006-315490, filed on Nov. 22, 2006, the entire contents of which are incorporated herein by reference.

BACKGROUND OF THE INVENTION

1. Field of the Invention

The present invention relates to a filter device, and more particularly, a filter device constituted of an acoustic wave element such as a surface acoustic wave (SAW) element having a resonance characteristic in the VHF/UHF band.

2. Description of the Related Art

The filter device is widely used in the communication field. In particular, the filter device using a surface acoustic wave (SAW) resonator, or a SAW filter (hereinafter generically termed SAW element), is largely used in mobile communication such as mobile telephone, because of being able to be compact in size with a low loss.

In recent years, mobile telephone becomes to have high functionality, and TV broadcast has become able to be watched by a mobile phone, with an analog TV tuner or a tuner for one-segment broadcast mounted thereon. However, when viewed from the TV tuner side, a mobile telephone signal, particularly a transmission signal of mobile telephone becomes a cause of trouble such as crosstalk, while when viewed from the mobile telephone side, a TV signal becomes a cause of trouble such as crosstalk.

To cite cases in European countries, TV signals exist in the VHF band (10-200 MHz) and the UHF band (470-750 MHz), while the transmission signals of mobile telephone exist in the 800 MHz band (880-915 MHz) and the 1.8 GHz band (1,710-1,785 MHz). Therefore, on the TV tuner side, there is required a low pass filter to pass the TV UHF band or lower, and to attenuate the 800 MHz band or higher. In contrast, on the mobile telephone side, there is required a high pass filter to pass the 800 MHz band or higher, and to attenuate the TV UHF band or lower.

Moreover, because 750 MHz on the high frequency side of the TV signals and 880 MHz on the low frequency side of the mobile telephone signals are very close to each other, it is necessary to realize a filter having a steep cut-off characteristic.

Further, in the circuit configuration of communication equipment, because elements having balanced terminals such as a frequency converter and an amplifier are generally connected before and after the filter device, the filter device is also required to have balanced input and output.

Conventionally, as a method for realizing a high pass filter or a low pass filter, a method of using a ladder type structure is known (for example, the official gazette of the Japanese Unexamined Patent Publication No. Hei-5-7125, which is hereafter referred to as Patent document 1).

FIG. 1 is a diagram illustrating an equivalent circuit when realizing a high pass filter with the ladder structure, described in the above Patent document 1. The structure is a cascade connection of unit filters, each configured of a series resonant circuit constituted of an inductance L and a capacitance C, and an impedance element Ie. Also, FIG. 2 is a diagram illustrating an equivalent circuit when realizing a low pass filter with a ladder structure described in Patent document 1. The structure is a cascade connection of unit filters, each configured of a parallel circuit of an inductance L and an impedance element Ie.

As can be understood from the equivalent circuits shown in FIGS. 1, 2, the structures of the high pass filter and the low pass filter described in the above Patent document 1 have unbalanced input and output. Further, because of the structure of the unit filters in cascade connection, there is a demerit of an increased number of cascade stages, causing an increased number of elements, to realize a steep cut-off characteristic.

SUMMARY OF THE INVENTION

Accordingly, considering such the conventional exemplary structure, it is an object of the present invention to realize a high pass filter or a low pass filter with balanced input and output, using a reduced number of elements.

It is another object of the present invention to provide a high pass filter or a low pass filter realizing a steep cut-off characteristic, so as to be usable for communication equipment using the above-mentioned frequency bands close to each other.

In a first aspect of a filter device to achieve the aforementioned objects of the present invention, the filter device including a lattice-type filter circuit having a resonator is provided. The above lattice-type filter circuit includes: a first and a second balanced signal terminal on the input side to be connected to an external balance circuit; a first and a second balanced signal terminal on the output side to be connected to an external balance circuit; a first resonator being connected to a series arm provided between the first balanced signal terminal on the input side and the first balanced signal terminal on the output side; a second resonator being connected to a series arm provided between the second balanced signal terminal on the input side and the second balanced signal terminal on the output side; a first resonant circuit including impedance elements, being connected to a lattice arm provided between the first balanced signal terminal on the output side and the second balanced signal terminal on the input side; and a second resonant circuit including impedance elements, being connected to a lattice arm provided between the second balanced signal terminal on the output side and the first balanced signal terminal on the input side.

In a second aspect of a filter device to achieve the aforementioned objects of the present invention, the filter device including a lattice-type filter circuit having a resonator is provided. The above lattice-type filter circuit includes: a first and a second balanced signal terminal on the input side to be connected to an external balance circuit; a first and a second balanced signal terminal on the output side to be connected to an external balance circuit; a first resonant circuit including impedance elements, being connected to a series arm provided between the first balanced signal terminal on the input side and the first balanced signal terminal on the output side; a second resonant circuit including impedance elements, being connected to a series arm provided between the second balanced signal terminal on the input side and the second balanced signal terminal on the output side; a first resonator being connected to a lattice arm provided between the first balanced signal terminal on the output side and the second balanced signal terminal on the input side; and a second resonator being connected to a lattice arm provided between the second balanced signal terminal on the output side and the first balanced signal terminal on the input side.

In the aforementioned first or second aspect, it is possible to configure each of the first resonant circuit and the second resonant circuit using a series resonant circuit.

In the aforementioned first or second aspect, it is possible to configure each of the first resonant circuit and the second resonant circuit using a parallel resonant circuit.

In the aforementioned first or second aspect, it is possible to configure such that at least one impedance element is connected in series with at least one resonator out of the first resonator and the second resonator.

In the aforementioned first or second aspect, it is possible to configure such that at least one impedance element is connected in parallel with at least one resonator out of the first resonator and the second resonator.

Further, in each of the aforementioned aspect, it may also be possible to configure such that a plurality of numbers of lattice-type filter circuits are connected.

Further scopes and features of the present invention will become more apparent by the following embodiments described according to the accompanied drawings.

BRIEF DESCRIPTION OF THE DRAWINGS

FIG. 7 shows a diagram illustrating an exemplary characteristic of the embodiment of a high pass filter according to the present invention.

FIG. 19 shows a diagram illustrating an exemplary characteristic of an embodiment in which low pass filters according to the present invention are connected in cascade.

DETAILED DESCRIPTION OF THE PREFERRED EMBODIMENTS

The preferred embodiment of the present invention is described herein after referring to the charts and drawings. However, the embodiments are illustrated for the sake of the explanation of the present invention, and therefore the technical scope of the present invention is not limited to the following descriptions.

Figure 1:
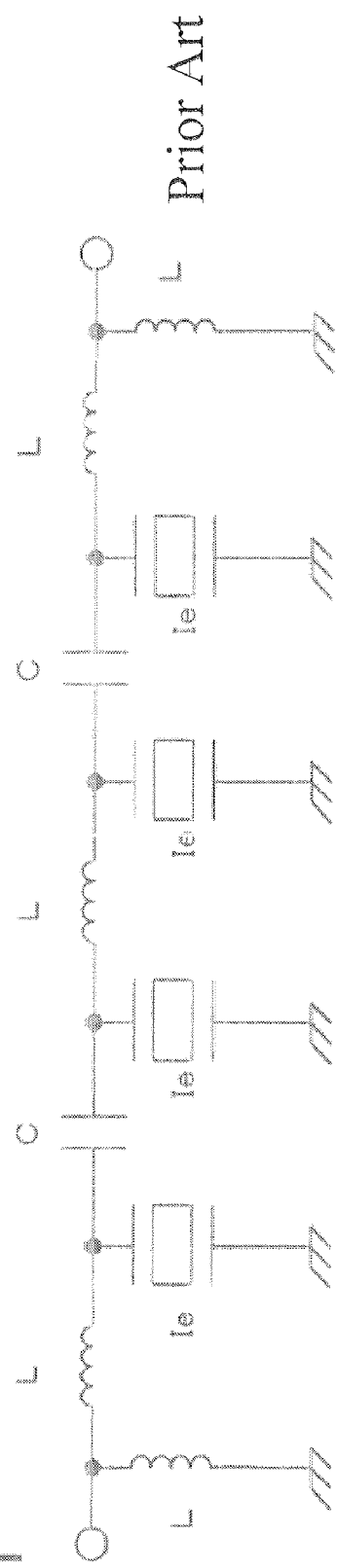
FIG. 1 shows a diagram illustrating a conventional example when realizing a high pass filter with a ladder structure.
Figure 2:
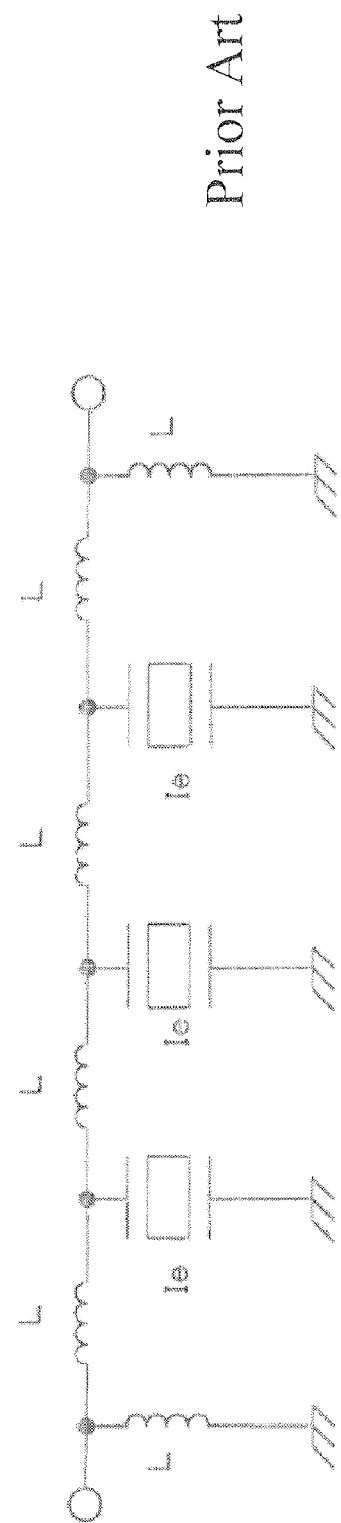
FIG. 2 shows a diagram illustrating a conventional example when realizing a low pass filter with a ladder structure.
Figure 3:
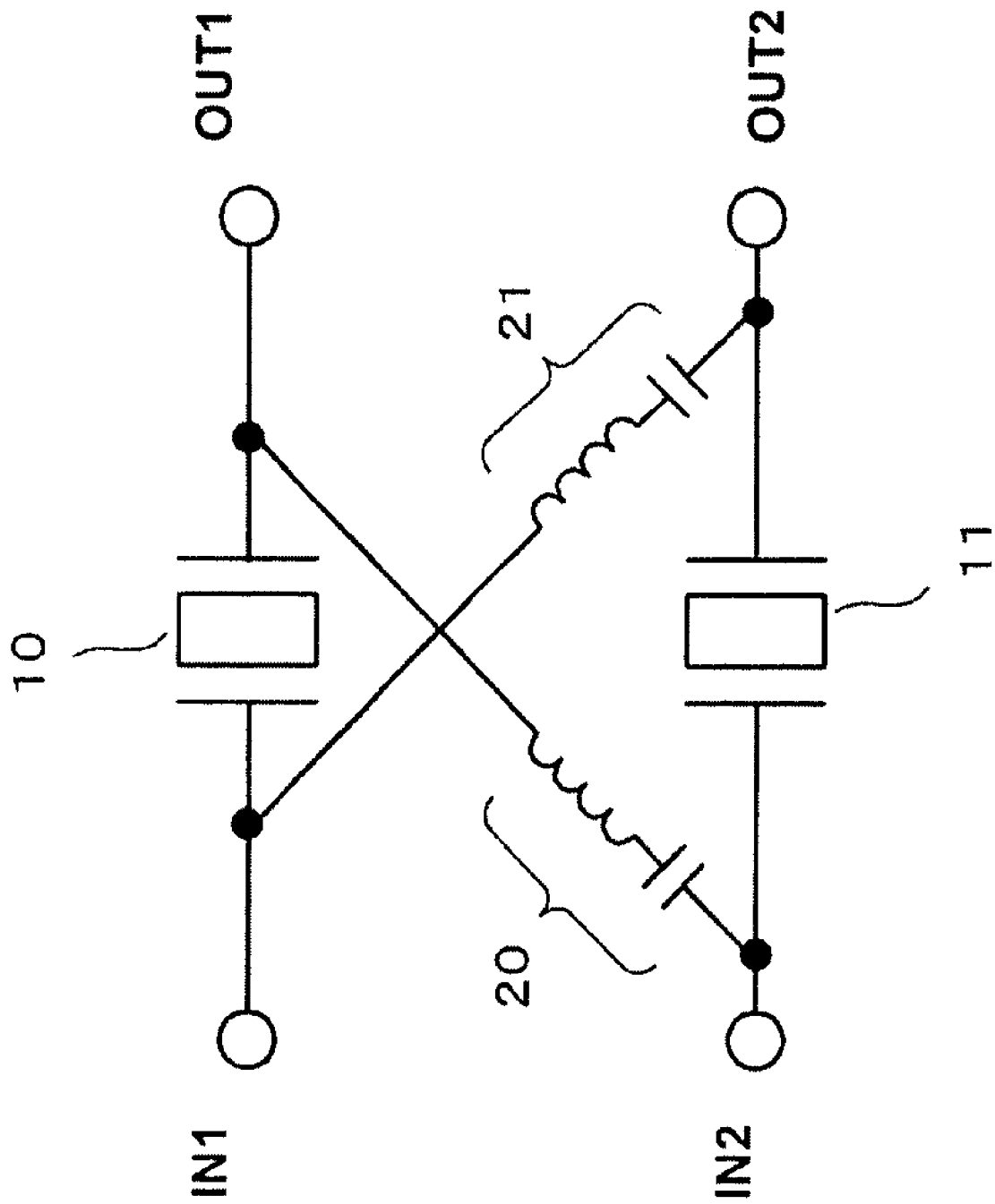
FIG. 3 shows a diagram illustrating an embodiment of a high pass filter according to the present invention.

FIG. 3 shows a first structure according to an embodiment of the present invention.

There are provided balanced signal terminals IN1, IN2 on the input side, which are to be connected to a non-illustrated external balanced circuit on the input side, and also balanced signal terminals OUT1, OUT2 on the output side, which are to be connected to a non-illustrated external balanced circuit on the output side.

Further, there are provided a first resonator 10 which is connected to a series arm provided between the balanced signal terminal IN1 on the input side and the balanced signal terminal OUT1 on the output side, and a second resonator 11 which is connected to a series arm provided between the balanced signal terminal IN2 on the input side and the balanced signal terminal OUT2 on the output side. Also, on a lattice arm provided between the balanced signal terminal OUT1 on the output side and the balanced signal terminal IN2 on the input side, a first resonant circuit 20 constituted of impedance elements is connected. Further, on a lattice arm provided between the balanced signal terminal OUT2 on the output side and the balanced signal terminal IN1 on the input side, a second resonant circuit 21 constituted of impedance elements is connected.

With the above structure, it is possible to realize a balanced input/output filter with an exceedingly small number of elements of two resonators and two resonant circuits in the minimum case.

As a first embodiment, the principle of the present invention will be described, taking an example when resonators are disposed on the series arms and series resonant circuits are disposed on the lattice arms, as shown in FIG. 3. Here, the frequency characteristics between resonators 10 and 11 provided on the series arms, as well as the frequency characteristics between series resonant circuits 20 and 21 provided on the lattice arms, are assumed to be virtually equivalent.

Figure 4:
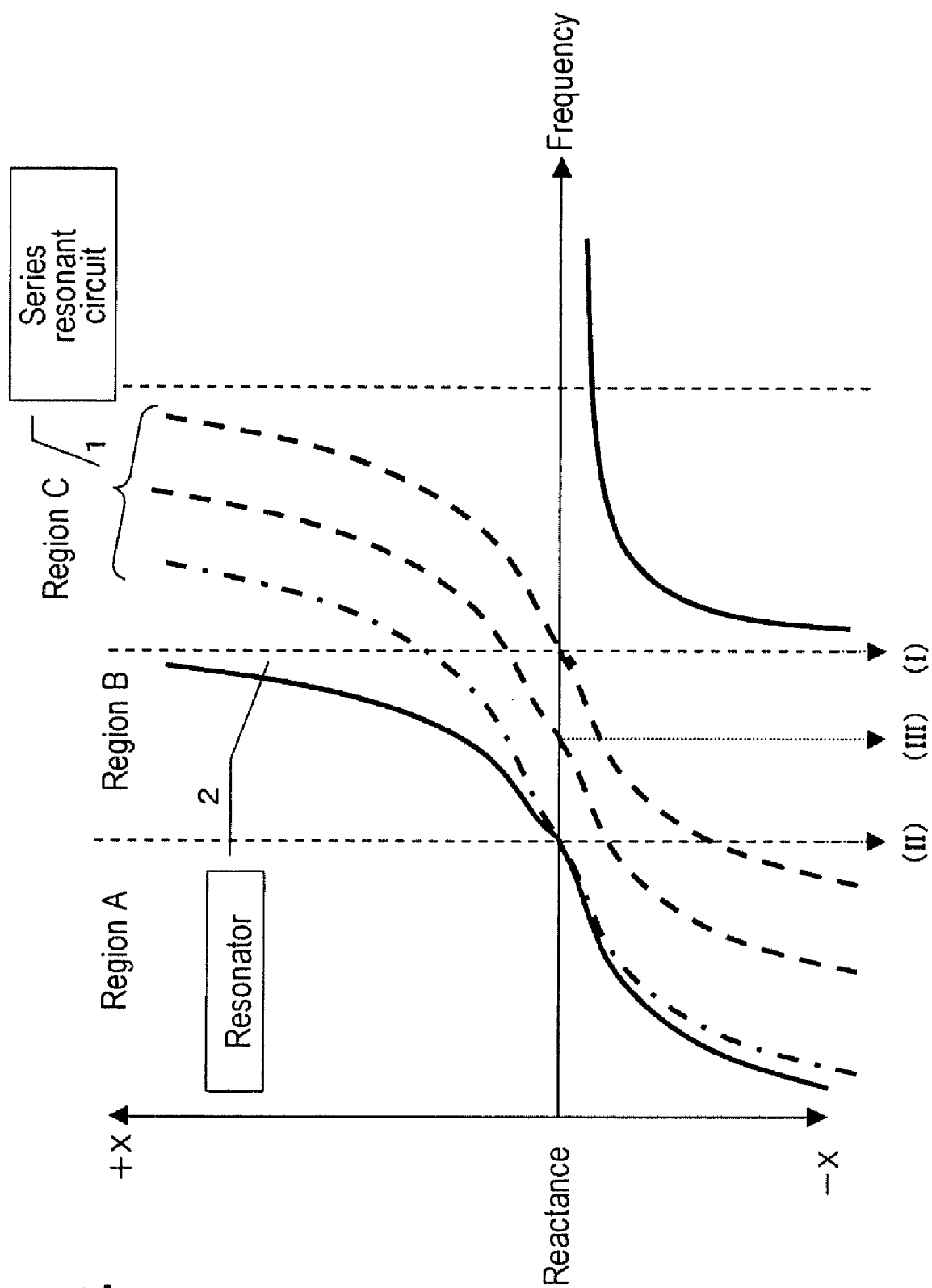
FIG. 4 shows a diagram illustrating the principle of a high pass filter according to the present invention.

FIG. 4 shows a resonance characteristic diagram illustrating the principle of the filter structure according to the present invention. The frequency is depicted on the horizontal axis, and the reactance is depicted on the vertical axis. In FIG. 4, a symbol '1' represents the resonance characteristics of each series resonant circuit 20, 21, while a symbol 121 represents the resonance characteristics of each resonator 10, 11.

Generally, as the basic principle of a lattice-type filter, a case having different signs of reactance between a series arm and a lattice arm produces a pass region, while a case having an identical sign produces a stop region. Similarly, in the embodiment shown in FIG. 3, a case having different signs of reactance between resonator 10, 11 on the series arm and series resonant circuit 20, 21 on the lattice arm produces a pass region, while a case having an identical sign produces a stop region.

As shown in FIG. 4, in the case (I) where the resonant frequency of series resonant circuit 20, 21 coincides with the antiresonant frequency of resonator 10, 11, the region A becomes a stop region because the signs of reactance between the series arm and the lattice arm are identical.

On the other hand, the region B and the region C become a pass region because the signs of reactance between the series arm and the lattice arm are different. Thus, a characteristic of a high pass filter is realized.

Further, in the case (II) where the resonant frequency in the resonance characteristic '1' of series resonant circuit 20, 21 coincides with the resonant frequency in the resonance characteristic '2' of resonator 10, 11 on the series arm, the region A and the region B shown in FIG. 4 become a stop region because the signs of reactance between the series arm and the lattice arm are identical, while the region C becomes a pass region because the signs are different. Accordingly, in such the case, a high pass filter characteristic having a stop region extending to a high frequency region is obtained.

Meanwhile, in the case (III) where the resonant frequency of series resonant circuit 20, 21 deviates from either the resonant frequency or the antiresonant frequency of resonator 10, 11 on the series arm, a stop region comes to exist between pass regions, which produces a ripple in an amplitude characteristic of the pass region.

As a means for reducing the ripple, it is possible to reduce by varying the frequency characteristics of resonator 10, 11 and series resonant circuit 20, 21.

Figure 6:
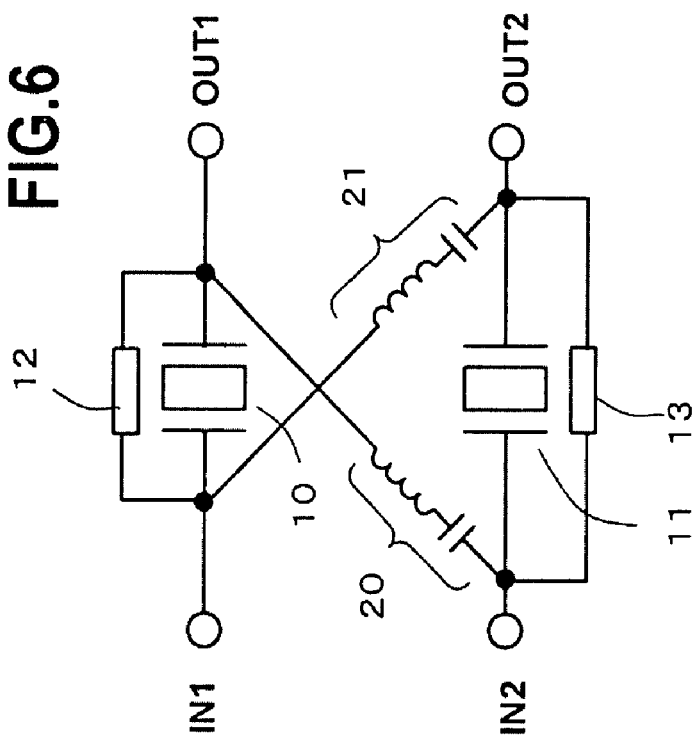
FIG. 6 shows a diagram illustrating an exemplary high pass filter in which an impedance element is connected in parallel with a resonator, among the embodiments of the high pass filter according to the present invention.
Figure 5:
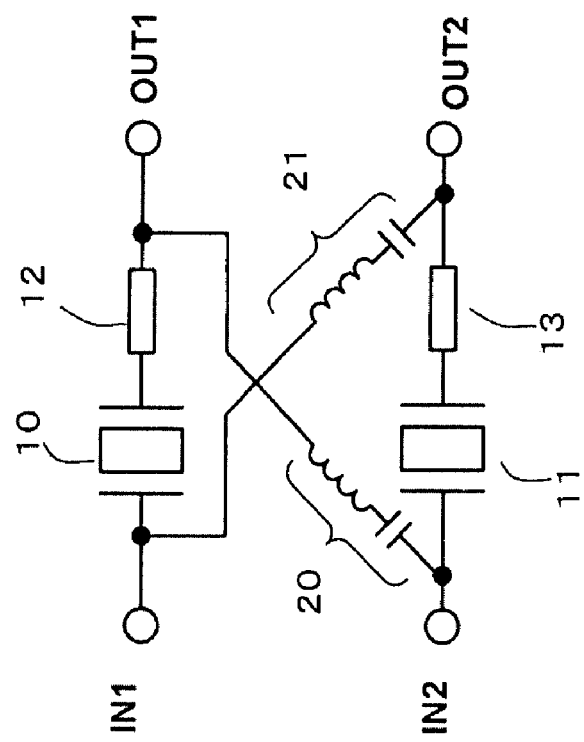
FIG. 5 shows a diagram illustrating an exemplary high pass filter in which an impedance element is connected in series with a resonator, among the embodiments of the high pass filter according to the present invention.

Also, it is possible to reduce the ripple by another means, according to the present invention. FIGS. 5, 6 show exemplary structures according to the present invention.

Namely, by connecting at least one impedance element 12, 13 in series (FIG. 5) or in parallel (FIG. 6) with one resonator 10, 11, it is possible to vary an apparent resonance characteristic.

With this, it is also possible to adjust the filter characteristic such as the reduction of the ripple.

FIG. 7 shows an exemplary high pass filter characteristic obtained from the above first embodiment, in which a surface acoustic wave (SAW) resonator is employed as resonator 10, 11. As can be understood from the figure, a high pass filter having an exceedingly steep cut-off characteristic, and producing a small loss up to a high frequency region, is obtained.

Figure 8:
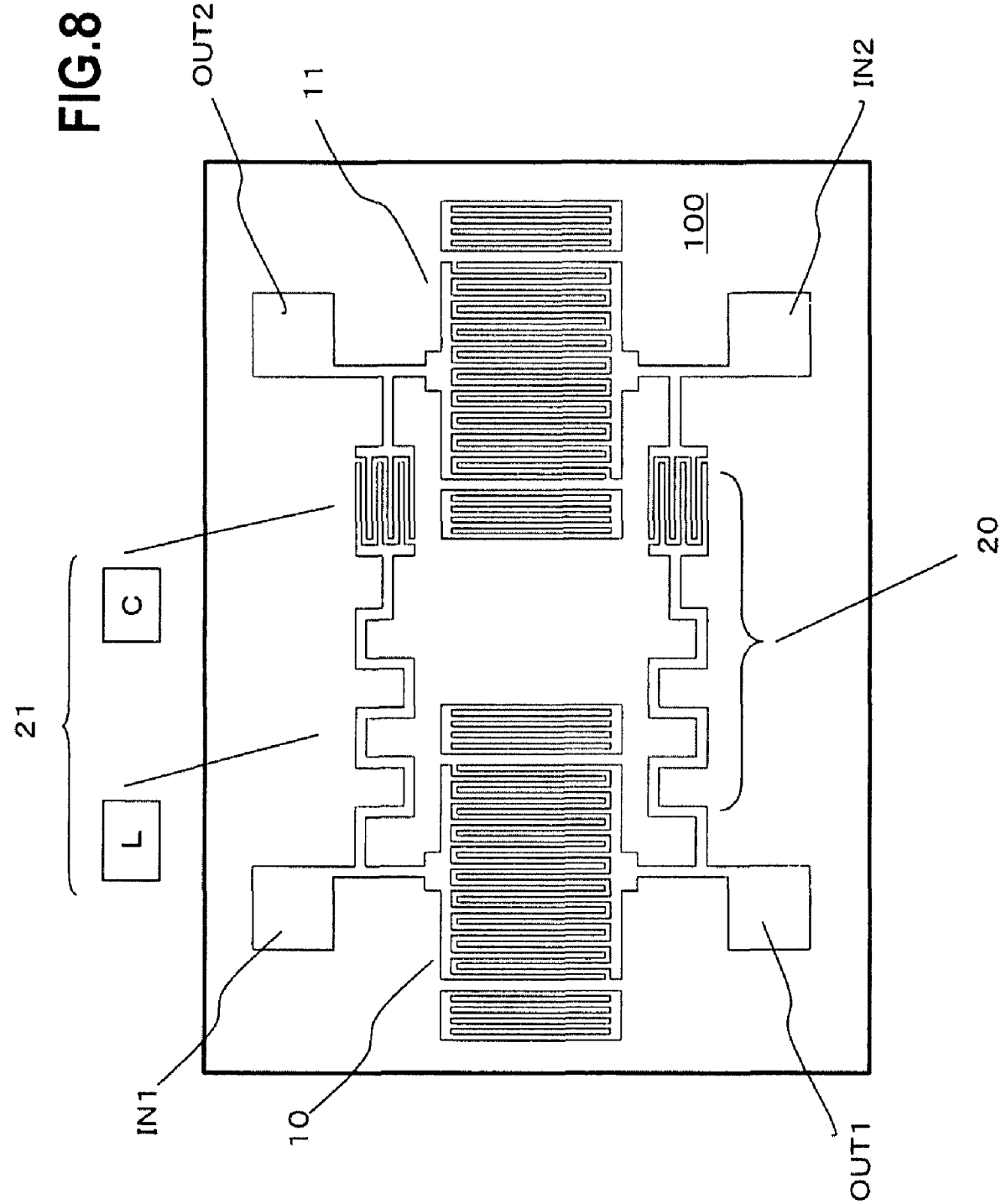
FIG. 8 shows a diagram illustrating an exemplary layout of the embodiment of a high pass filter according to the present invention.

FIG. 8 shows a diagram illustrating a device plane (layout) of a high pass filter formed of a surface acoustic wave (SAW) resonator, corresponding to the equivalent circuit shown in FIG. 3.

In FIG. 8, balanced input terminals IN1, IN2 and balanced output terminals OUT1, OUT2 are formed on a piezoelectric substrate 100, by metal deposition such as Al.

Further, each resonator 10, 11 is constituted of a SAW resonator by depositing an electrode pattern on piezoelectric substrate 100, thereby forming a comb electrode and reflective electrodes on both sides thereof. Similarly, each series resonant circuit 20, 21 is formed by patterning and depositing a conductive material such as Al on piezoelectric substrate 100, so as to form an inductance L and a capacitance C to configure the series resonant circuit.

Here, in the above description, an exemplary configuration of a high pass filter according to the present invention has been explained. The application of the present invention is not limited to the high pass filter. Using the same principle, it is also possible to apply to a low pass filter which will be described later.

According to the layout shown in FIG. 8, miniaturization becomes possible by disposing resonators 10, 11 and series resonant circuits 20, 21 on the identical piezoelectric substrate 100. When an impedance element value becomes large, it becomes difficult to dispose on the identical substrate, needless to say. Then, it may also be possible to employ a lumped constant or a distributed constant element, etc., so as to dispose in an identical package.

Alternatively, it may also be possible to dispose outside the package, as an externally attached component, or to make the own package include the function of an impedance element, using LTCC (Low Temperature Cofired Ceramics), etc.

Figure 9:
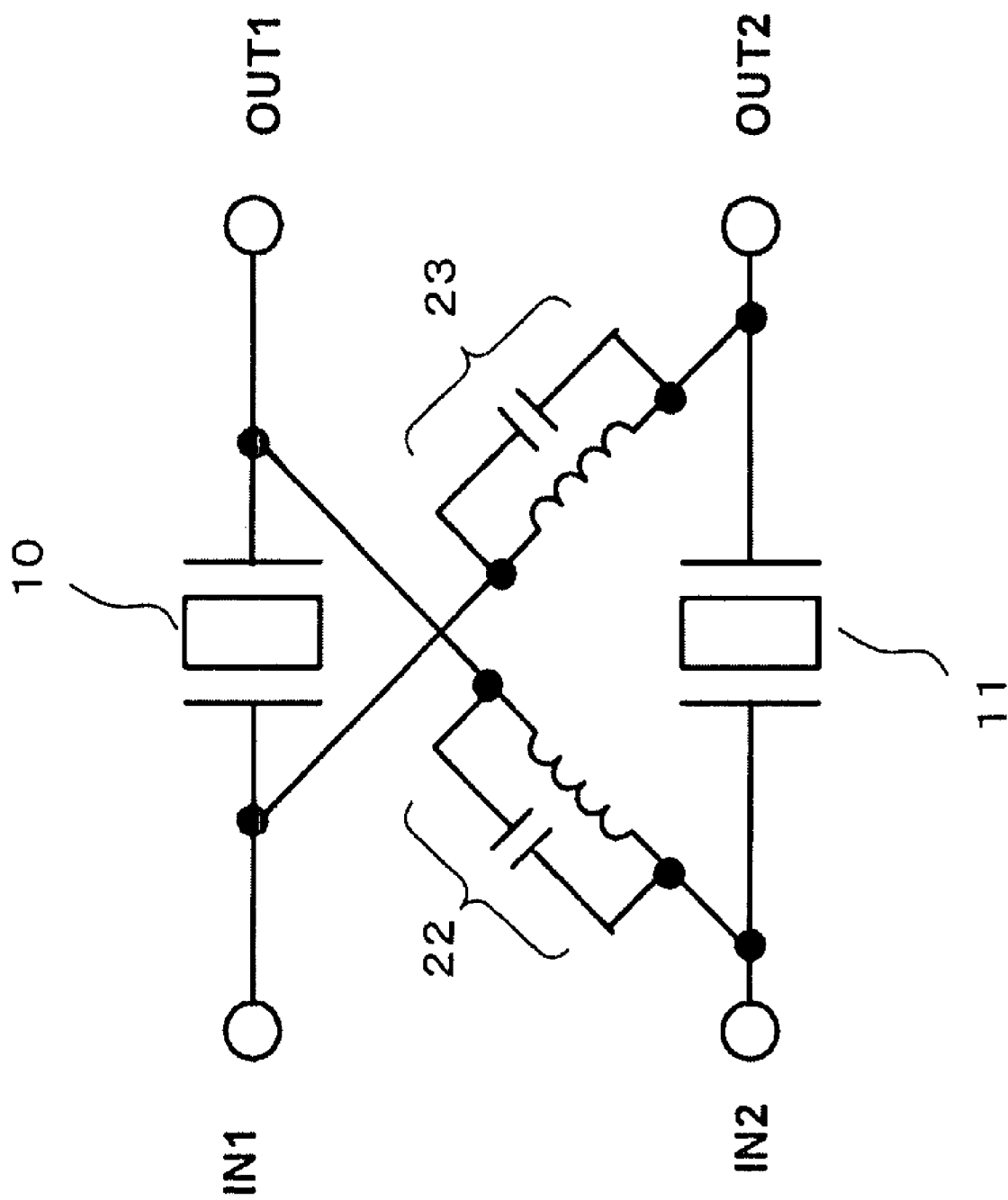
FIG. 9 shows a diagram illustrating an embodiment of a low pass filter according to the present invention.

FIG. 9 shows an exemplary structure of a low pass filter according to the present invention, as a second embodiment of the present invention.

In FIG. 9, there are provided balanced signal terminals IN1, IN2 on the input side, which are to be connected to a non-illustrated external balanced circuit on the input side, and also balanced signal terminals OUT1, OUT2 on the output side, which are to be connected to a non-illustrated external balanced circuit on the output side.

Further, there are provided at least one first resonator 10 which is connected to a series arm provided between the balanced signal terminal IN1 on the input side and the balanced signal terminal OUT1 on the output side, and at least one second resonator 11 which is connected to a series arm provided between the balanced signal terminal IN2 on the input side and the balanced signal terminal OUT2 on the output side. Also, on a lattice arm provided between the balanced signal terminal OUT1 on the output side and the balanced signal terminal IN2 on the input side, at least one first resonant circuit 22 including impedance elements is connected. Further, on a lattice arm provided between the balanced signal terminal OUT2 on the output side and the balanced signal terminal IN1 on the input side, at least one second resonant circuit 23 including impedance elements is connected.

The difference from the structure shown in FIG. 3 is that first resonant circuit 22 and second resonant circuit 23 including impedance elements and being provided on the lattice arms are parallel resonant circuits.

Figure 10:
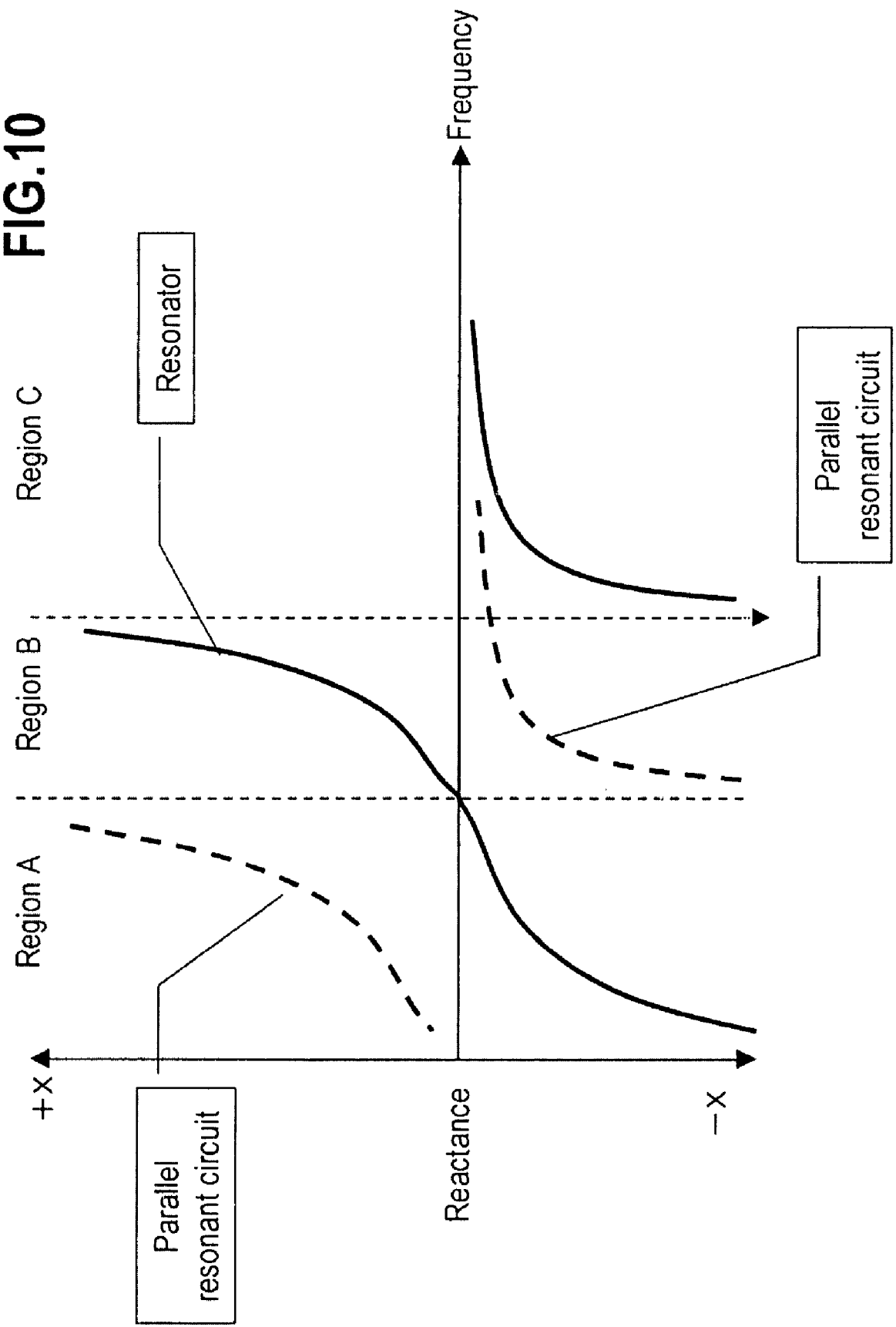
FIG. 10 shows a diagram illustrating the principle of a low pass filter according to the present invention.

Corresponding to the structure shown in FIG. 9, in the comparison with the resonance characteristic diagram shown in FIG. 4, FIG. 10 shows resonance characteristics obtained from resonators 10, 11 and parallel resonant circuits 22, 23.

As having been described earlier, based on the basic principle of the lattice-type filter, a case having different signs of reactance between resonator 10, 11 on the series arm and parallel resonant circuit 22, 23 on the lattice arm produces a pass region, while a case having an identical sign therebetween produces a stop region.

Accordingly, in the example shown in FIG. 10, the signs are different in the region A and the region B, thus producing a pass region, while the signs are identical in the region C, thus producing a stop region, and thus, a low pass filter is obtained.

With the above structure, using an exceedingly small number of elements of two resonators and two resonant circuits in the minimum case, the low pass filter having balanced input and output can be realized.

Here, as having been described in the exemplary high pass filter in the first embodiment, when the resonant frequency of parallel resonant circuit 22, 23 coincides with the antiresonant frequency of resonator 10, 11 in the series arm, the signs of reactance between the series arm and the lattice arm become different in the region A, and identical in the regions B and C. By this, the stop region is extended to a lower frequency region, which causes no particular problem.

Meanwhile, when the resonant frequency of parallel resonant circuit 22, 23 deviates from the resonant frequency or the antiresonant frequency of resonator 10, 11 on the series arm, a stop region comes to extent between the pass region, which produces a ripple in an amplitude characteristic of the pass region.

Figure 11:
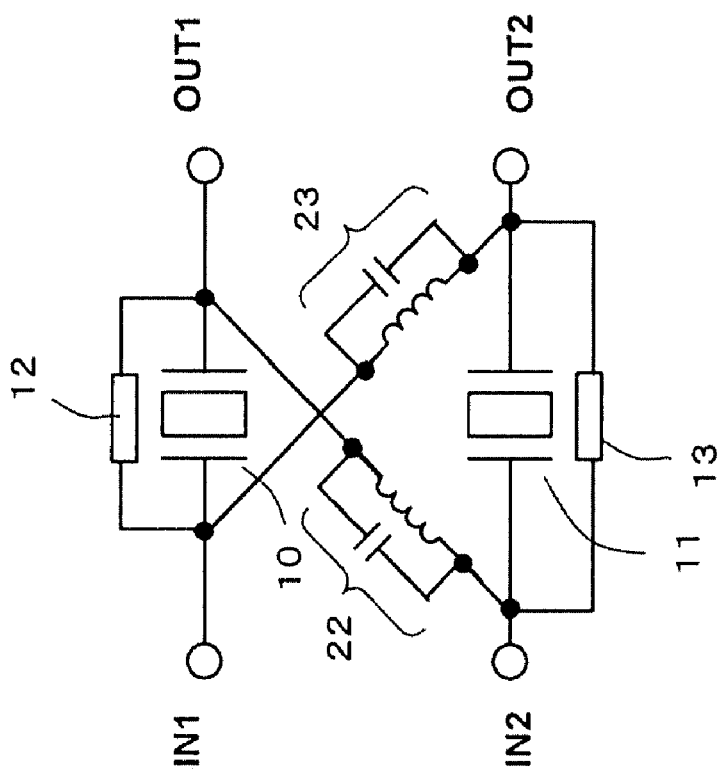
FIG. 11 shows a diagram illustrating an exemplary low pass filter in which an impedance element is connected in series with a resonator, among the embodiments of the low pass filter according to the present invention.
Figure 12:
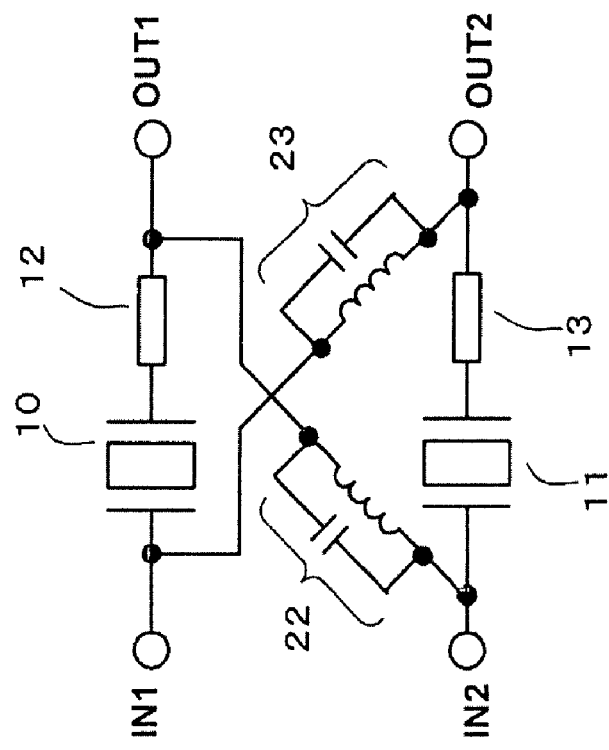
FIG. 12 shows a diagram illustrating an exemplary low pass filter in which an impedance element is connected in parallel with a resonator, among the embodiments of the low pass filter according to the present invention.

As a means for reducing the ripple, it is possible to vary an apparent resonance characteristic by connecting at least one impedance element in series (FIG. 11) or in parallel (FIG. 12) with at least one resonator in the present structure, as another method than varying the frequency characteristics of the resonator and the parallel resonant circuit.

By this, it is also possible to adjust the filter characteristic such as the reduction of the ripple.

Figure 13:
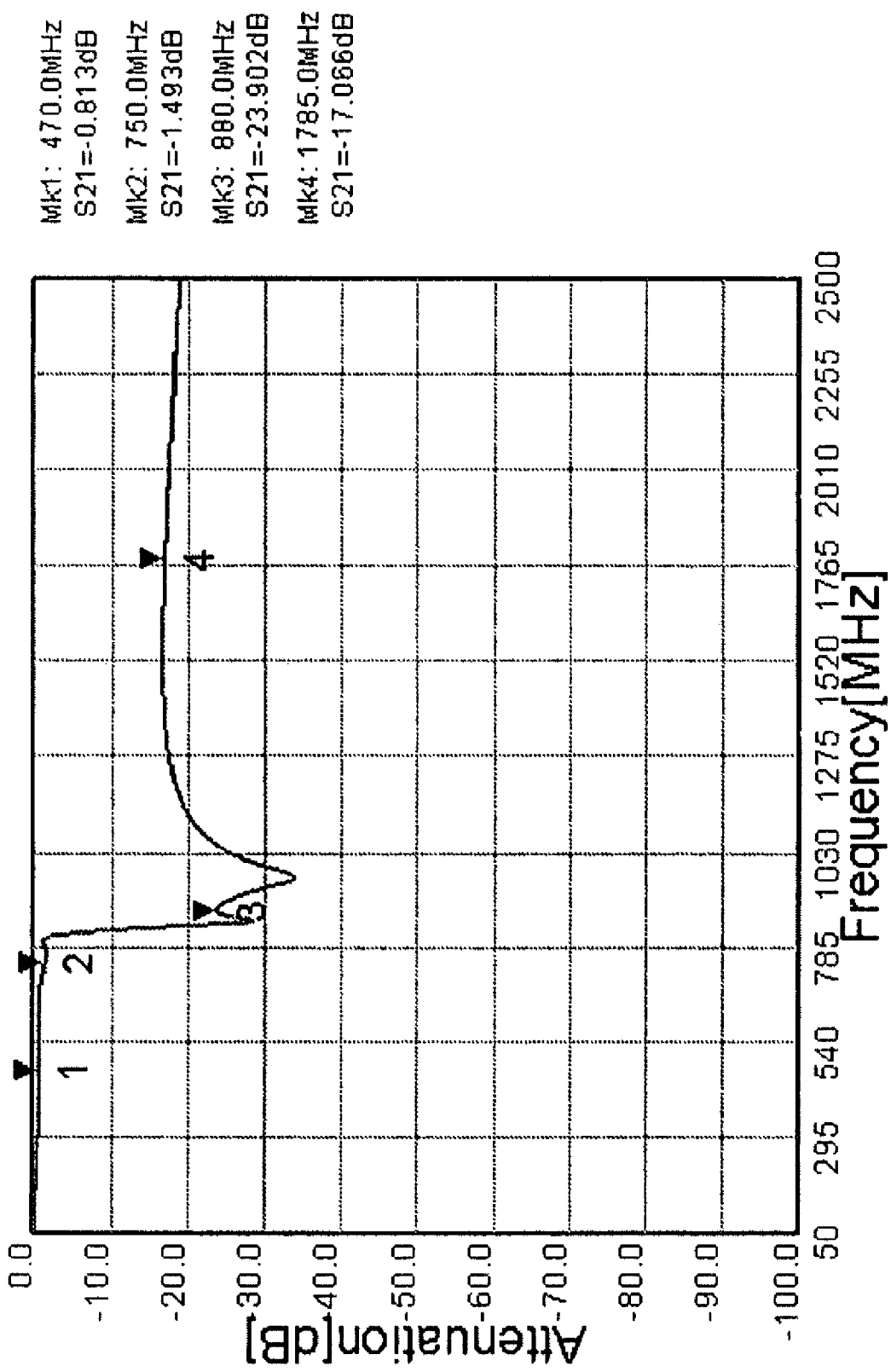
FIG. 13 shows a diagram illustrating an exemplary characteristic of the embodiment of a low pass filter according to the present invention.

FIG. 13 shows a typical example of the characteristic when a SAW resonator is used as resonator 10, 11. It is understood from the figure that an excellent low pass filter having an exceedingly steep cut-off characteristic, with a low loss up to a very low frequency region has been realized.

As in the above-mentioned second embodiment, similar to the first embodiment shown earlier in FIG. 8, it is possible to configure a low pass filter by forming the SAW resonator on the piezoelectric substrate.

Here, the types of resonator 10, 11 in the structure of the present invention are not limited to the SAW resonator illustrated in the embodiment. However, in case of employing an acoustic wave element, such as surface acoustic wave (SAW) element, bulk surface wave (BAW) element and piezoelectric thin film resonator (FBAR), it is possible to realize a steeper cut-off characteristic because a high resonance Q value can be obtained. Also, it is possible to dispose the acoustic wave element on an identical substrate, and therefore, miniaturization becomes easy.

Further, in the above first and second embodiments, the impedance elements constituting the series circuit and the parallel circuit to be applied to the present invention are not limited. The effect of the present invention does not vary if any of inductance element, capacitance element, lumped constant element, distributed constant element, etc. is used. Similarly, impedance element 12, 13 aimed at adjusting the filter characteristic such as ripple reduction, illustrated in the embodiments shown in FIGS. 5, 6, 11 and 12, is not limited to the element of a particular type.

Also, it is possible to form a product by housing, into an identical package, the resonators and the impedance elements in the structure of the present invention. Or, instead of housing in the identical package, it is possible to make at least one impedance element as an externally attached component to be mounted on a printed circuit board, etc. Further, when the resonators in the structure of the present invention is an acoustic wave element, it is possible to configure the impedance element on the same piezoelectric substrate 100 as the resonators 10, 11 are mounted on, as shown in FIG. 8.

Figure 15:
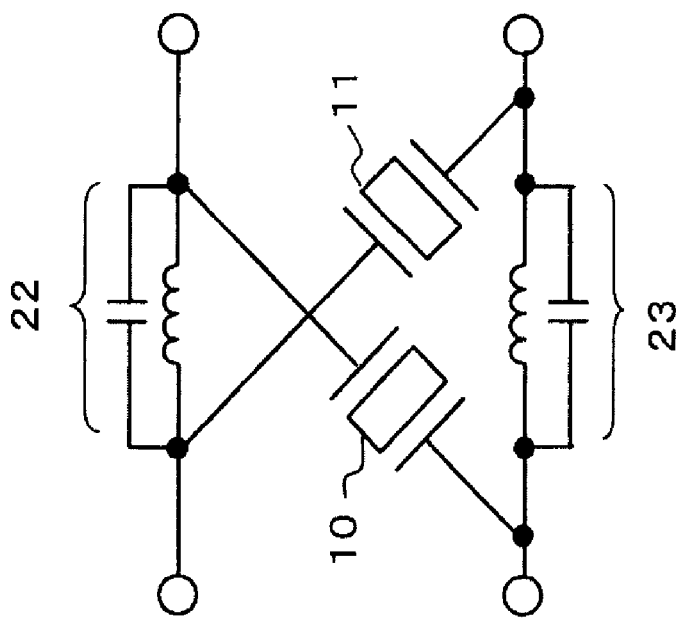
FIG. 15 shows a diagram illustrating an example in which a series arm is exchanged with a lattice arm, among the embodiments of a low pass filter according to the present invention.
Figure 14:
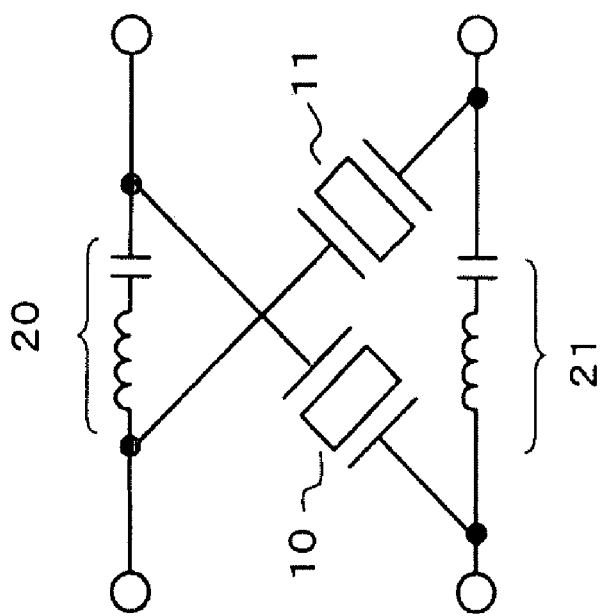
FIG. 14 shows a diagram illustrating an example in which a series arm is exchanged with a lattice arm, among the embodiments of a high pass filter according to the present invention.

Moreover, in the application of the present invention, from the principle of a lattice filter, the characteristic does not vary even if the series arm and the lattice arm shown in FIG. 3 or FIG. 9 are exchanged with each other, as shown in FIG. 14 or FIG. 15.

Further, by connecting at least two or more filter devices each having the structure of the present invention, it is possible to strengthen the attenuation in the stop region greater. Or, it is also possible to reduce input and output impedance by connecting at least two or more in parallel.

Figure 16:
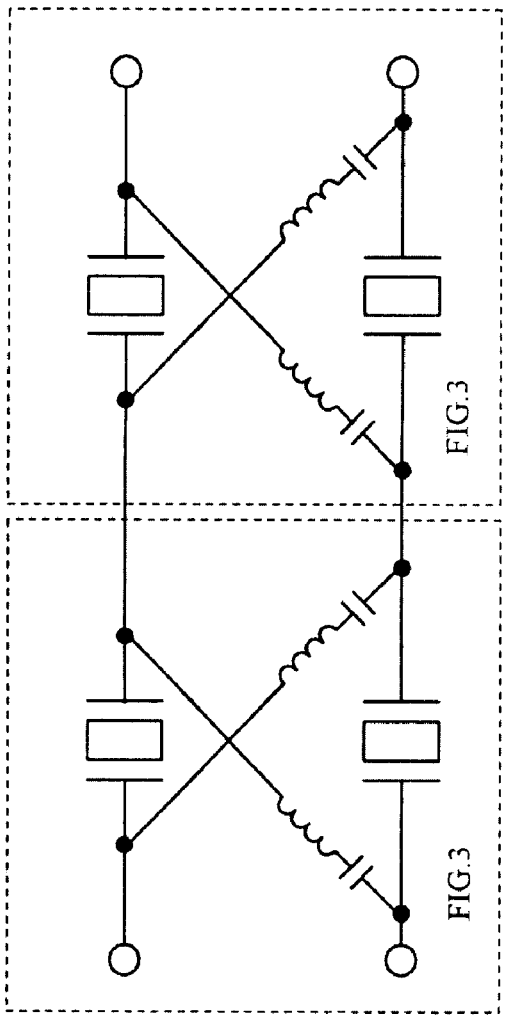
FIG. 16 shows a diagram illustrating an example in which the present filter devices are connected in cascade, among the embodiments of a high pass filter according to the present invention.

FIG. 16 shows an exemplary structure of two-stage cascade connection of the structure shown in FIG. 3. Also, FIG. 17 shows an exemplary structure of two-stage cascade connection of the structure shown in FIG. 9.

Figure 18:
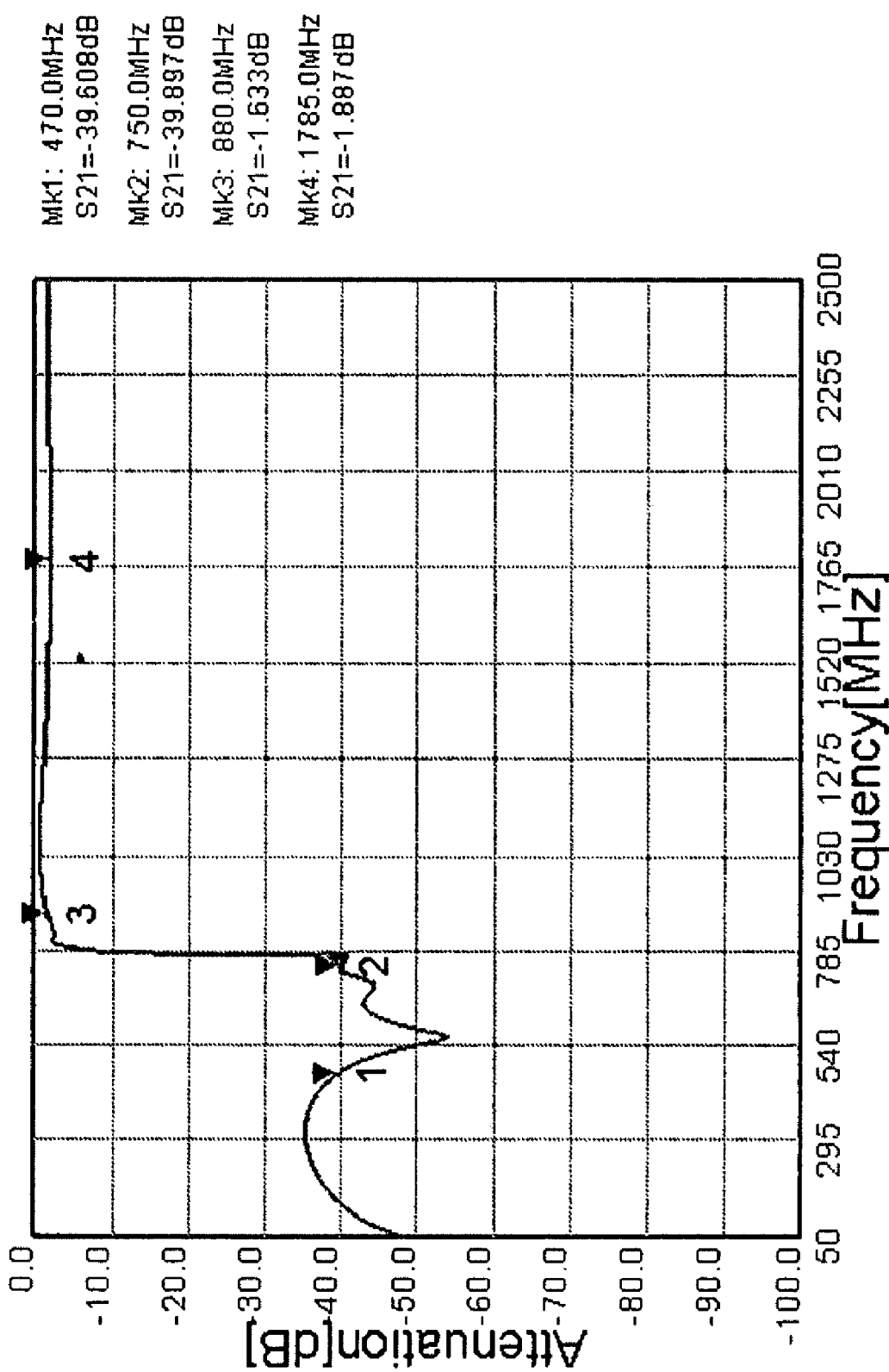
FIG. 18 shows a diagram illustrating an exemplary characteristic of an embodiment in which high pass filters according to the present invention are connected in cascade.

FIG. 18 shows an exemplary characteristic in case of two-stage cascade connection of the high pass filters, as shown in FIG. 16, each having the structure shown in FIG. 3.

Figure 17:
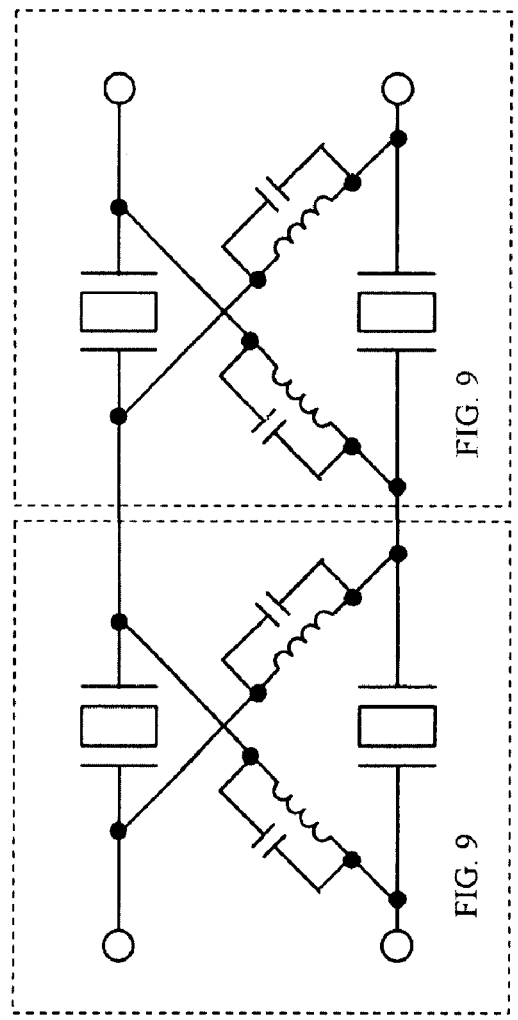
FIG. 17 shows a diagram illustrating an example in which the present filter devices are connected in cascade, among the embodiments of a low pass filter according to the present invention.

FIG. 19 shows an exemplary characteristic in case of two-stage cascade connection of the low pass filters, as shown in FIG. 17, each having the structure shown in FIG. 9.

In order to have an optimal characteristic when connected in cascade, the design of resonators and resonant circuits in the first and the second stages are differentiated. By the two-stage cascade connection, both characteristics shown in FIGS. 18, 19 have higher attenuation characteristics in the stop region, as compared with FIGS. 7, 13.

Also, in the above description, both input side and output side are connected to balanced circuits. In contrast, when it is required to make either input side or output side to be unbalanced, it may be sufficient if a balance-unbalance conversion means is connected to at least one of the input side and the output side of the filter device having the structure of the present invention. The above balance-unbalance conversion means may be housed in the same package as the filter device having the structure of the present invention, or the function may be provided in the own package using LTCC (Low Temperature Cofired Ceramics), etc. Or, it is possible to handle the filter device to which the present invention is applied, as an externally attached component when mounting on a printed circuit board.

As described above, according to the present invention, it is possible to realize a high pass filter or a low pass filter having balanced input and output with a reduced number of elements, and a steep cut-off characteristic as well. With this, a compact filter device having an excellent characteristic can be designed.

The foregoing description of the embodiments is not intended to limit the invention to the particular details of the examples illustrated. Any suitable modification and equivalents may be resorted to the scope of the invention. All features and advantages of the invention which fall within the scope of the invention are covered by the appended claims.

What is claimed is:

1. A filter device including a lattice-type filter circuit having a resonator, wherein the lattice-type filter circuit comprises:
   first and second balanced signal terminals on the input side to be connected to an external balance circuit;
   first and second balanced signal terminals on the output side to be connected to an external balance circuit;
   a first resonator being connected to a series arm provided between the first balanced signal terminal on the input side and the first balanced signal terminal on the output side;
   a second resonator being connected to a series arm provided between the second balanced signal terminal on the input side and the second balanced signal terminal on the output side;
   only a first resonant circuit consisting of impedance elements, being connected to a lattice arm provided between the first balanced signal terminal on the output side and the second balanced signal terminal on the input side; and only a second resonant circuit consisting of impedance elements, being connected to a lattice arm provided between the second balanced signal terminal on the output side and the first balanced signal terminal on the input side, wherein the impedance elements of the first and second resonant circuits consist of inductance and capacitance elements, and wherein the resonant frequencies of the first and second resonant circuits are substantially equal to the antiresonant frequencies of the first and second resonators.

2. The filter device according to claim 1, wherein each of the first resonant circuit and the second resonant circuit is a series resonant circuit.

3. The filter device according to claim 1, wherein each of the first resonant circuit and the second resonant circuit is a parallel resonant circuit.

4. The filter device according to claim 1, wherein at least one impedance element is connected in series with at least one resonator out of the first resonator and the second resonator.

5. The filter device according to claim 1, wherein at least one impedance element is connected in parallel with at least one resonator out of the first resonator and the second resonator.

6. The filter device according to claim 1, wherein a plurality of numbers of the lattice-type filter circuits are connected.

7. The filter device according to claim 1, wherein the first and the second resonators have virtually equal frequency characteristics.

8. The filter device according to claims 1, wherein the first and the second resonant circuits have virtually equal frequency characteristics.

9. A filter device including a lattice-type filter circuit having a resonator, wherein the lattice-type filter circuit comprises:

a first and a second balanced signal terminal on the input side to be connected to an external balance circuit;

a first and a second balanced signal terminal on the output side to be connected to an external balance circuit;

only a first resonant circuit consisting of impedance elements, being connected to a series arm provided between the first balanced signal terminal on the input side and the first balanced signal terminal on the output side;

only a second resonant circuit consisting of impedance elements, being connected to a series arm provided between the second balanced signal terminal on the input side and the second balanced signal terminal on the output side;

a first resonator being connected to a lattice arm provided between the first balanced signal terminal on the output side and the second balanced signal terminal on the input side; and a second resonator being connected to a lattice arm provided between the second balanced signal terminal on the output side and the first balanced signal terminal on the input side, wherein the impedance elements of the first and second resonant circuits consist of inductance and capacitance elements, and wherein the resonant frequencies of the first and second resonant circuits are substantially equal to the antiresonant frequencies of the first and second resonators.

10. The filter device according to claim 9, wherein each of the first resonant circuit and the second resonant circuit is a series resonant circuit.

11. The filter device according to claim 9, wherein each of the first resonant circuit and the second resonant circuit is a parallel resonant circuit.

12. The filter device according to claim 9, wherein at least one impedance element is connected in series with at least one resonator out of the first resonator and the second resonator.

13. The filter device according to claim 9, wherein at least one impedance element is connected in parallel with at least one resonator out of the first resonator and the second resonator.

14. The filter device according to claim 9, wherein a plurality of numbers of the lattice-type filter circuits are connected.

15. The filter device according to claim 9, wherein the first and the second resonators have virtually equal frequency characteristics.

16. The filter device according to claims 9, wherein the first and the second resonant circuits have virtually equal frequency characteristics.

17. A filter device including a lattice-type filter circuit having a resonator, wherein the lattice-type filter circuit comprises:

a first and a second balanced signal terminal on the input side to be connected to an external balance circuit;

a first and a second balanced signal terminal on the output side to be connected to an external balance circuit;

a first resonator being connected to a series arm provided between the first balanced signal terminal on the input side and the first balanced signal terminal on the output side;

a second resonator being connected to a series arm provided between the second balanced signal terminal on the input side and the second balanced signal terminal on the output side;

a first resonant circuit including impedance elements, being connected to a lattice arm provided between the first balanced signal terminal on the output side and the second balanced signal terminal on the input side; and a second resonant circuit including impedance elements, being connected to a lattice arm provided between the second balanced signal terminal on the output side and the first balanced signal terminal on the input side, wherein the impedance elements of the first and second resonant circuits consist of inductance and capacitance elements, and wherein the resonant frequencies of the first and the second resonant circuits are substantially equal to the resonant frequencies of the first and the second resonators.

18. A filter device including a lattice-type filter circuit having a resonator, wherein the lattice-type filter circuit comprises:

a first and a second balanced signal terminal on the input side to be connected to an external balance circuit;

a first and a second balanced signal terminal on the output side to be connected to an external balance circuit;

a first resonant circuit including impedance elements, being connected to a series arm provided between the first balanced signal terminal on the input side and the first balanced signal terminal on the output side;

a second resonant circuit including impedance elements, being connected to a series arm provided between the second balanced signal terminal on the input side and the second balanced signal terminal on the output side;

a first resonator being connected to a lattice arm provided between the first balanced signal terminal on the output side and the second balanced signal terminal on the input side; and a second resonator being connected to a lattice arm provided between the second balanced signal terminal on the output side and the first balanced signal terminal on the input side, wherein the impedance elements of the first and second resonant circuits consist of inductance and capacitance elements, and wherein the resonant frequencies of the first and the second resonant circuits are substantially equal to the resonant frequencies of the first and the second resonators.

* * * * *